United States Patent [19]
Wilson

[11] 3,937,986
[45] Feb. 10, 1976

[54] LINEAR WAVEFORM GENERATOR

[75] Inventor: Arnold Wilson, Hertford, England

[73] Assignee: Rank Xerox Ltd., London, England

[22] Filed: Mar. 11, 1974

[21] Appl. No.: 450,270

[30] Foreign Application Priority Data
Mar. 23, 1973 United Kingdom............... 14211/73

[52] U.S. Cl. ................ 307/228; 307/293; 307/310
[51] Int. Cl.² .......................................... H03K 4/08
[58] Field of Search.................... 307/228, 293, 310

[56] References Cited
UNITED STATES PATENTS

| | | | |
|---|---|---|---|
| 3,189,844 | 6/1965 | MacKenzie | 307/228 |
| 3,194,977 | 7/1965 | Anzalone et al. | 307/310 |
| 3,313,955 | 4/1967 | Brisay, Jr. | 307/228 |
| 3,509,367 | 4/1970 | Orsen | 307/228 |
| 3,551,705 | 12/1970 | Juliusburger | 307/293 |
| 3,619,659 | 11/1971 | Meyer et al. | 307/310 |
| 3,794,857 | 2/1974 | Milovancevic | 307/293 |

OTHER PUBLICATIONS
"Ramp Generator Has Adjustable Retrace" by Tenny in Electronic Design 20, Sept. 27, 1970, p. 71.

*Primary Examiner*—Stanley D. Miller, Jr.

[57] ABSTRACT

A transistor timing ramp generator having collector, emitter and base electrodes and having a capacitor connected between collector and base, a resistance connected between base and emitter, the emitter being connected directly to a first input terminal, a resistive load in the collector circuit and means for supplying a signal to a second input terminal in the collector circuit and the input terminal to switch on the transistor when said signal is supplied, and to operate in the region where the base-emitter potential is substantially constant, thus providing a constant current to charge the capacitor and thereby obtaining a linear timing ramp at the collector which approaches the potential of said signal.

2 Claims, 8 Drawing Figures

LINEAR WAVEFORM GENERATOR

BACKGROUND OF THE INVENTION

This invention relates to a transistor timing ramp generator.

The Miller effect has been used in conventional timing ramp generators, and a Miller amplifier has been used to produce a linear decreasing output waveform during the period of an input pulse of constant amplitude applied to the input of the amplifier. In this arrangement, the amplifier consumes power continuously, and is not switched off at the end of the input pulse.

SUMMARY OF THE INVENTION

According to the present invention there is provided a transistor timing ramp generator having collector, emitter and base electrodes and having a capacitor connected between collector and base, a resistance connected between base and emitter, the emitter being connected directly to a first input terminal, a resistive load in the collector circuit and means for supplying a signal to a second input terminal in the collector circuit and the input terminal to switch on the transistor when said signal is supplied, and to operate in the region where the base-emitter potential is substantially constant, thus providing a constant current to charge the capacitor and thereby obtaining a linear timing ramp at the collector which approaches the potential of said signal.

The potential between the base and the emitter, although substantially constant, does vary with temperature and it is therefore sometimes necessary to include a temperature compensation means within the base-emitter circuit in order to keep the potential across the emitter base resistor constant. When the transistor is of silicon, such means may comprise a germanium diode in series with the emitter base resistor with the junction of the resistor and the diode connected through a further resistor to the said second input terminal. The temperature coefficients of the germanium diode and the base emitter junction of the silicon transistor are approximately equal and cancel each other out in the effect of temperature on the voltage across the base-emitter resistor of the transistor.

A firing circuit may be connected across the collector load which will fire when the potential at the collector terminal reaches a given value. Firing can be achieved by means of a programmable unijunction arranged to latch down after having reached the said collector potential, so that power is only taken from said signal supply means by the said transistor from the start of the signal until the circuit fires.

A sequential firing circuit can be provided with a number of firing states connected across the collector load arranged to fire at different potentials across the collector load, and an insulating device can be connected in all but the last firing circuits in order to prevent the transistor switching off until all the firing circuits have fired.

The two stage transistor device can be provided, with the capacitive coupling between the base of one transistor and the collector of a second transistor, the base of the second transistor connected from the base of the second transistor to the emitter of that transistor and to said first input terminal.

A constant current device may be connected in the collector circuit of the transistor, in order to provide further stabilization of the base-emitter voltage, and current injection means may be provided between said signal source and the base of the transistor, in order to provide a further degree of control of the rate of rise of the ramp.

When it is desired to reset the circuit quickly, an amplifier may be connected between the output of a firing circuit and the base of the transistor through a diode in order quickly to discharge the capacitor.

DESCRIPTION OF THE PREFERRED EMBODIMENTS

Figure 1:
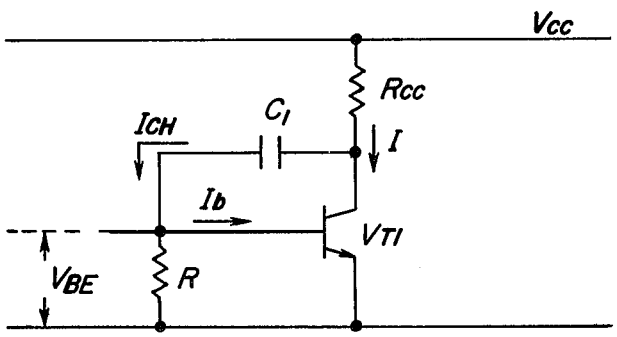
FIG. 1 represents a basic circuit.

In FIG. 1, a transistor VTI has its emitter connected directly to the earth line which is connected to an input terminal. In the collector circuit of the transistor is a load RC connected to a signal supply line VCC. A capacitor Cl is connected between the base and collector electrodes of the transistor, and the resistor R is connected between the base and emitter electrodes.

Assuming, when the transistor is switched on, the current passing through the capacitor is very much greater than the base current, the capacitor charging current will be equal to VBE over R. VBE depends on the collector current of the transistor, the magnification factor and the temperature. The first two of these parameters do not vary significantly over the range of the transistor characteristic to be used, or for temperature constant conditions, the basic circuit can be used with the capacitor charging current substantially constant.

With the capacitor charging current constant, the voltage at the collector of the transistor will rise linearly towards the signal supply potential VCC when the potential is applied to the supply line, the potential between it and the input terminal increasing at a rate inversely proportional to R and C. The rate can therefore be adjusted by adjusting the value of the resistor R.

Figure 2:
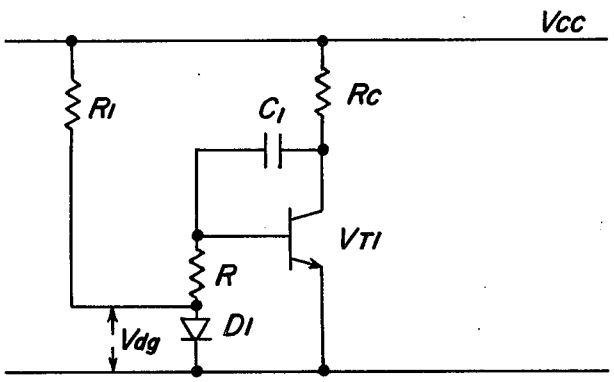
FIG. 2 represents a basic circuit with temperature compensation.

When the temperature is likely to vary, a diode DL can be included in the base emitter circuit as shown in FIG. 2, with the junction of the resistor R and the diode D1 being connected through a further resistor R1 to the signal supply line. The charging current through the capacitor is now proportional to the difference of the potentials across the base and emitter and across the diode, and using a germanium diode and a transistor which have approximately equal temperature coefficient, the charging current becomes substantially independent of temperature.

Figure 3:
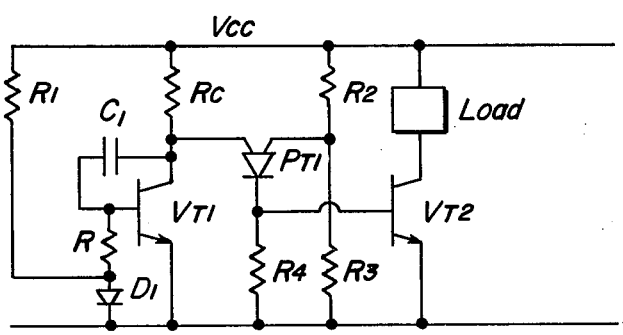
FIG. 3 represents a circuit including a firing circuit.

FIG. 3 shows a firing circuit connected across the collector load of transistor VTI. The firing circuit comprises an AND gate PT1 having one input connected to the collector of the transistor VT1, and the second input connected to the potential divider line between the signal supply line and the input terminal. When the potential of the capacitor reaches the potential set by the voltage divider, the AND gate fires and provides a signal to a second transistor VT2, thus switching on a load in the collector circuit of that transistor. The firing of the gate Pt1 discharges the capacitor C1 and turns the transistor off. The transistor is thus only conducting between the start of the signal and the firing of the AND gate. The AND gate is shown here as a programmable unijunction transistor, used in the latching mode so that, after firing, the collector load of VT2 is held on until power is removed from the circuit. For simplicity, the protective diodes have been omitted from the circuit diagram of the firing arrangements.

Figure 4:
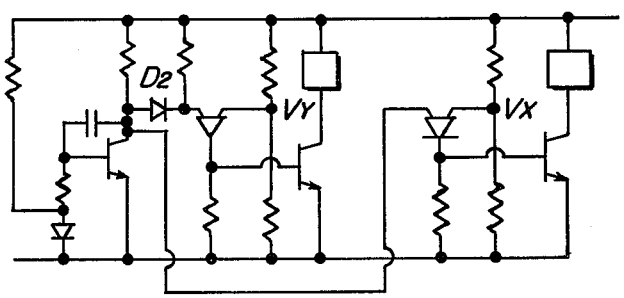
FIG. 4 represents a circuit with sequential firing circuits.

FIG. 4 shows two firing circuits connected to the collector of the main transistor VT1, the first circuit being connected by means of a diode D2 which prevents the firing of the PUT from switching off the transistor VT1, time allowing it to continue to produce a linear ramp until the second firing circuit fires. Clearly, further firing circuits could be provided, each with a separate diode D2, although if the last firing circuit had a diode, separate means would have to be provided to switch off the transistor VT1.

Figure 5:
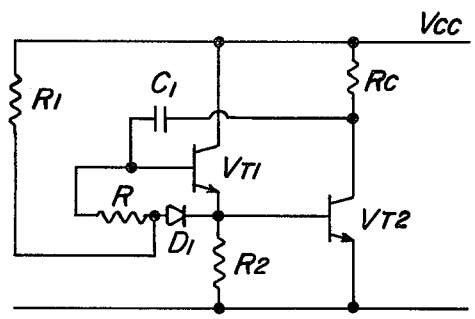
FIG. 5 represents a two stage basic timer.

In order to produce linear ramps rising at a slower rate, a two-stage timer can be provided as shown in FIG. 5. In this circuit, the capacitor is not connected to the collector of the main transistor, but to the collector of a second transistor whose base is connected to the emitter of the first transistor, and whose emitter is connected to the input terminal. The emitter of the first transistor is connected through a further resistor to the input terminal, and the linear waveform is taken from the collector load of the second transistor. The second transistor acts as an emitter follower stage which reduces the base current of the first stage, thus allowing lower capacitor charging current to be used. The basic circuit of FIG. 1 can provide a linearly increasing ramp extending up to about 20 seconds, after which it becomes too expensive in most cases to provide a capacitor of sufficient size. The emitter follower stage provided by the second transistor reduces the current flow through the capacitor and main resistor of the first transistor, thus providing a slow rate of charging. The second stage can increase the duration of the linear ramp by a factor of about 30.

Figure 6:
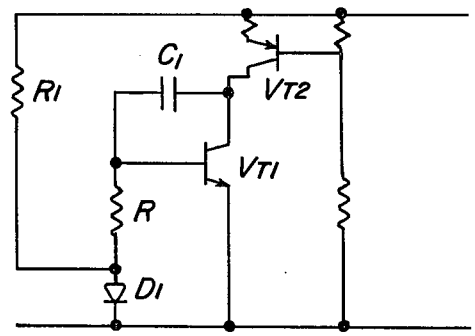
FIG. 6 shows a basic circuit with a constant current feed.

In FIG. 6, the circuit of FIG. 2 is provided with a constant current device in the collector circuit of the transistor VT1. The constant current device comprises a transistor VT2 of opposite conductivity type to the transistor VT1, whose base is connected to the junction of a voltage divider formed by a pair of resistors connected across the supply line and input terminal. The constant current device of FIG. 6 provides further stabilization of the base-emitter voltage of the main transistor VT1.

Figure 7:
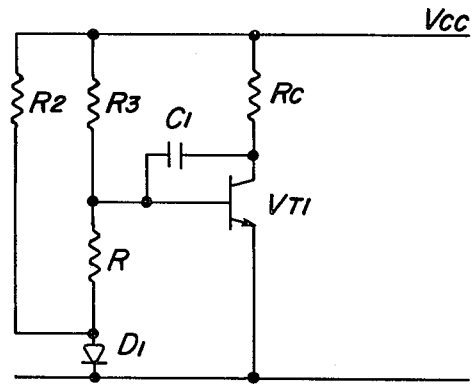
FIG. 7 shows a basic circuit with current injection.

Further control of the rate of rise of the ramp can be provided by the current injection circuit shown in FIG. 7. This circuit comprises a resistor connected between the supply line and the base of the transistor. The injection of current by this circuit reduces the current charging the capacitor, thus reducing the rate of rise of the ramp.

Figure 8:
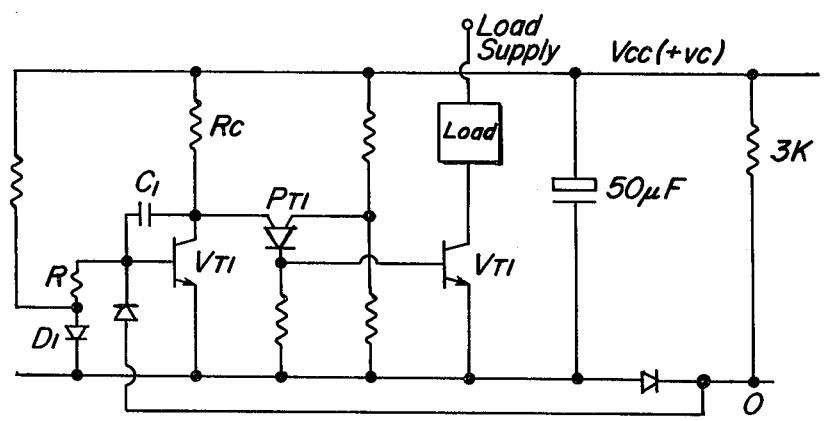
FIG. 8 represents a quick release circuit.

FIG. 8 shows the circuit of FIG. 3 with a quick release facility. The 50 microfarad capacitor connected between the supply line and the input terminal provides a current source which is connected by the means of two diodes to the emitter of the main transistor VT1 to enable the capacitative coupling of the transistor emitter and collector to be quickly discharged. When the firing circuit fires, the main transistor VT1 will switch off. Without the quick release circuit, the capacitor C1 will take an appreciable time to discharge completely when the power is removed from the circuit. The additional circuit of FIG. 8 stores charge in the 50 microfarad capacitor when power is applied to the signal line, and this charge is available through the diodes to discharge the capacitor c1 through the main transistor after the removal of power. The capacitor of 50 microfarads enables the capacitor c1 to be discharged within 50 miliseconds of the firing of the firing circuit.

The circuit of FIG. 8 allows, with the values of component shown, the ramp generator to be reset quickly when the voltage is removed from the input. The energy stored in the $50\mu F$ capacitor supplies current to the base of VT1 for a short time (less than 50mS) after the input voltage has been removed. This bottoms transistor VT1 thus discharging capacitor C1 quickly, so that the timing cycle can be restarted in the shortest time possible.

What is claimed is:

1. A timing ramp generating comprising first and second transistors each having collector, emitter and base electrodes, a capacitor connected between base of said first transistor and the collector of said second transistor, a resistance connected between the base and emitter of said first transistor, the emitter of said first transistor being connected to a first terminal and the base of said second transistor, a resistive load coupled intermediate the collector of said second transistor, and a second terminal, said second terminal connected to the collector of said first transistor, source of d.c. voltage connected across said first and second terminals, whereby a constant current charges the capacitor and a linear timing ramp is generated at the collector of said second transistor which approaches the applied d.c. voltage.

2. A timing ramp generator including a main transistor having collector, emitter and base electrodes and having a capacitor connected between collector and base, a resistance connected between base and emitter, the emitter being connected directly to a first terminal, a resistive load in the collector circuit, means for supplying a d.c. voltage across a second input terminal in the collector circuit and the first terminal to switch on the transistor when said voltage is supplied, and to operate in the region where the base-emitter potential is substantially constant, thus providing a constant current to charge the capacitor and thereby obtaining a linear timing ramp at the collector which approaches the potential of said signal, a constant current device in the collector circuit of said main transistor, said constant current device includes a second transistor of opposite conductivity type to said main transistor, said second transistor havings its base connected to a reference potential, the collector-emitter circuit of said second transistor being connected in series with the collector emitter circuit of said main transistor across said first and second terminals.

* * * * *